United States Patent Office 3,231,827

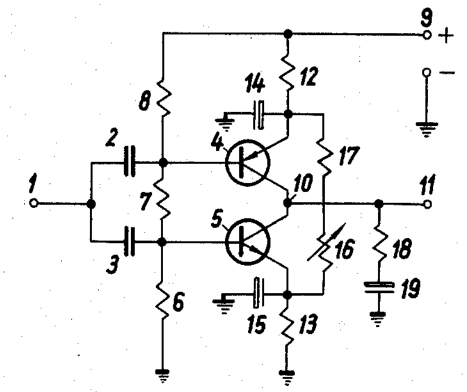
Fig.1
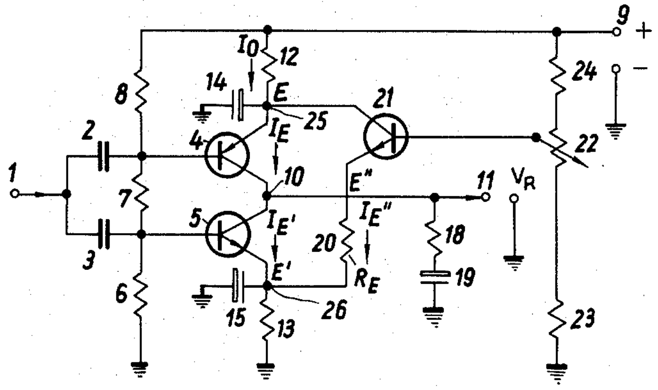
Fig.2
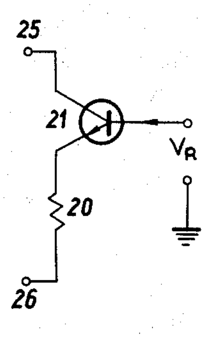
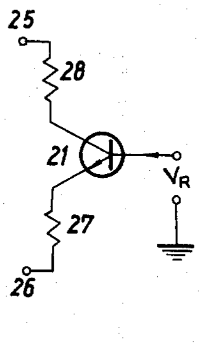
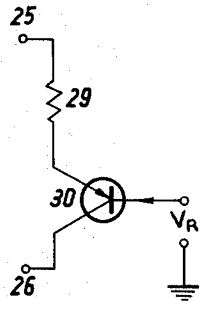
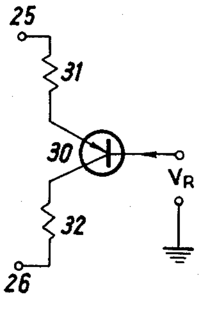
Fig.3 Fig.4 Fig.5 Fig.6
Jnventor:
Ernst Legler
by attorney:
Michael S. Striker Inventor:
Ernst Legler
by attorney:
Michael S. Striker Inventor:
Ernst Legler by Michael J. Striker
Attorney

Patented Jan. 25, 1966

3,231,827

VARIABLE GAIN TRANSISTOR AMPLIFIER

Ernst Legler, Darmstadt, Germany, assignor to Fernseh G.m.b.H., Darmstadt, Germany Filed Jan. 22, 1963, Ser. No. 253,115
Claims priority, application Germany, Feb. 3, 1962, F 35,908
9 Claims. (Cl. 330—13)

Figure 7:
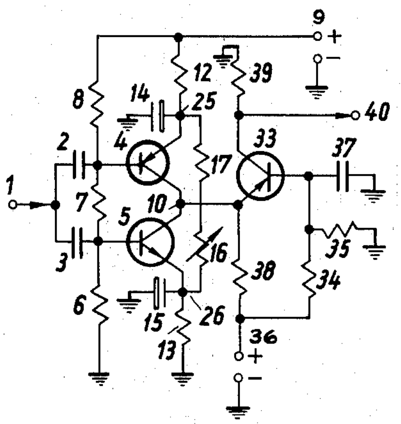

The present invention relates generally to transistor amplifiers, and more particularly to transistor amplifiers including means provision for controlling the gain of the amplifiers.

The gain of a known transistor amplifier may be altered by shifting the working point of one or more amplifying transistors. For the automatic control of signal amplitude this shifting of the working point may be effected by means of a control voltage, derived by rectification of the output voltage of the amplifier, which is applied to the amplifier in order to alter the emitter current of the controlled transistors. Owing to the curvature of the transistor characteristics, however, effective control can be produced without substantial signal distortion only when the amplitude of the input signal applied to the controlled transistor is relatively small. This known circuit arrangement therefore has the disadvantage that it operates with adequate linearity (negligible differential amplitude distortion) only for relatively small signal amplitudes.

It is a broad object of the present invention to provide a novel gain control circuit operating with adequate linearity for relatively large signal amplitudes.

It is a further object of the present invention to provide a novel gain control circuit which is especially suitable for varying the gain of wideband signals such as television video signals.

It is another object of the present invention to provide a gain control system for transistor amplifiers operating with adequate linearity for relatively large television video signal amplitudes.

It is still another object of the present invention to provide a gain control system for a vision mixer circuit arrangement.

According to the present invention there is provided a transistor amplifier comprising two transistors of opposite conductivity types having their collectors connected directly together and to an output terminal and having their emitters connected by way of respective resistors to the opposite poles of a direct voltage source, together with means for applying a signal to be amplified in common to the bases of said transistors by means permitting said bases to be maintained at different direct voltages, in which there is connected between the emitters of said transistors a circuit of variable resistance to direct current.

A transistor amplifier of variable gain according to the present invention has the advantage that good linearity (small differential amplitude distortion) may be obtained by its use. This is because the two transistors of complementary types are connected in parallel as regards alternating signal currents and in series as regards direct currents, thus providing compensation for the oppositely curved transistor characteristics. It is an advantage of a transistor amplifier according to the invention that particularly good stability of amplification may be obtained by the application of direct current negative feedback.

Figure 8:
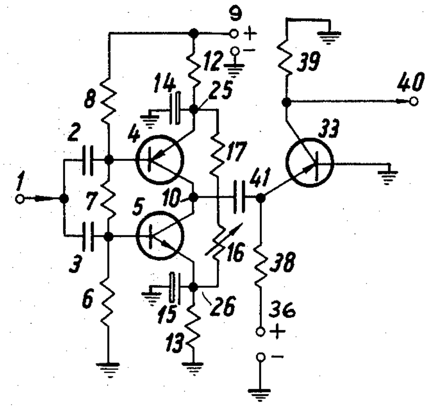
Figure 9:
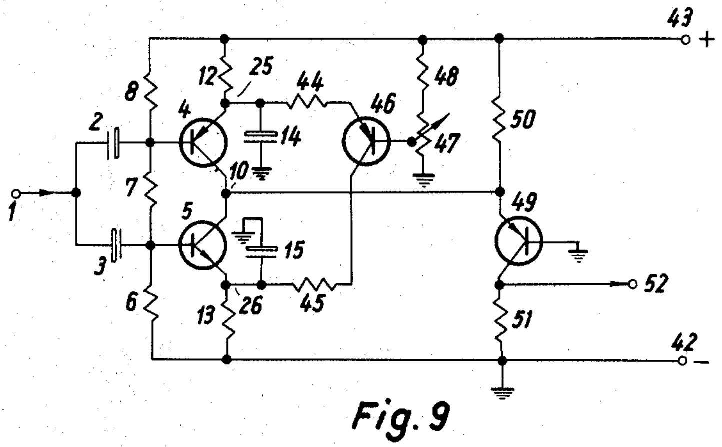
Figure 10:
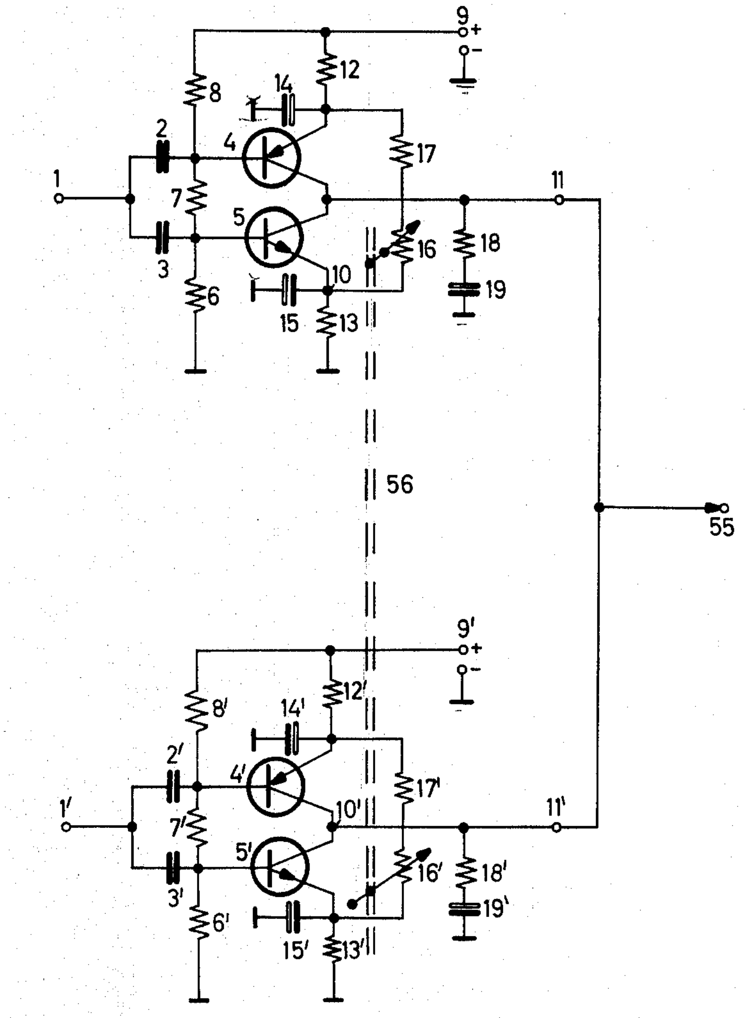

The novel features which are considered as characteristic for the invention are set forth in particular in the appended claims. The invention itself, however, both as to its construction and its method of operation together with additional objects and advantages thereof, will be best understood from the following description of specific embodiments when read in connection with the accompanying drawings, in which:

FIGURE 1 is a circuit diagram of one embodiment of variable gain transistor amplifier according to the present invention, FIGURE 2 is a circuit diagram of an alternative embodiment of variable gain amplifier according to the present invention, FIGURES 3 to 6 show alternative embodiments of variable resistance elements which may be used in the amplifier shown in FIGURE 1, FIGURES 7 and 8 show alternative embodiments of variable gain amplifiers according to the present invention combined with additional amplifier stages, FIGURE 9 shows the circuit of a preferred embodiment of variable gain transistor amplifier according to the present invention, and FIGURE 10 is a circuit diagram of a vision mixer circuit arrangement according to the present invention.

In all these drawings corresponding elements are designated by the same reference symbols.

In the circuit shown in FIGURE 1 a video signal received at an input terminal 1 is applied equally through capacitors 2 and 3 to the bases of two transistors 4 and 5 respectively, which are of opposite conductivity types. A chain of three resistors 6, 7 and 8 connected across a diret voltage source provides appropriate bias potentials for the bases of transistors 4 and 5. The negative pole of this voltage source and one end of resistor 6 are connected with the ground potential lead and the positive pole of this voltage source is connected with terminal 9. The collectors of transistors 4, 5 are connected via the point 10 with an output terminal 11, while their emitters are returned to the positive and negative lines respectively by way of resistors 12 and 13, and are also bypassed to ground by way of respective capacitors 14 and 15.

In accordance with the present invention the gain of the amplifier is adjusted by a variable resistance element connected between the emitters of transistors 4 and 5. In the present embodiment the variable resistance element comprises a variable resistor 16 connected in series with a fixed resistor 17. Maximum gain is obtained when resistor 16 is set to its maximum value and minimum gain when it is set to its minimum.

Resistors 12 and 13 provide negative feedback for direct current, while capacitors 14, 15 prevent this feedback from being operative at signal frequencies. The collector resistor 18 is connected in series with a blocking condenser 19.

The invention is based upon the fact that the slope of the emitter-current/base voltage characteristic for a junction transistor is proportional to the emitter current, a fact which results from the exponential form of this characteristic. In order to avoid relatively poor linearity (large differential amplitude distortion) transistors 4 and 5 of opposite conductivity type are connected in parallel for alternating currents while they are connected in series as regards direct current, so that they are traversed by the same emitter current.

As long as current flows in transistors 4 and 5 the potentials of their emitters are approximately equal to the potentials of their respective bases. With germanium transistors, for example, the difference in potential is only some 0.1–0.2 volt. Since the base potentials of transistors 4 and 5 are held constant by resistor chain 6, 7, 8, the corresponding emitter potentials are also practically constant. An approximately constant direct current thus flows through the emitter resistors 12 and 13.

A portion of this current, which is adjustable by varying the value of resistor 16, flows through the branch circuit provided by series connected resistors 16 and 17. The rest of the current flows through the emitter-collector paths of transistors 4 and 5. The current through these transistors, and thus the gain available from them, may thus be altered by adjustmet of resistor 16.

At the junction-point 10 of the collector of transistors 4 and 5 there is no change in direct voltage when the gain of amplifier is adjusted, since the emitter-collector paths of transistors 4 and 5 represent equal resistances for direct current and the common collector potential is thus midway between the two emitter potentials.

In the circuit arrangement described in relation to FIGURE 1 there is not necessarily a linear relation between the value of variable resistor 16 and the gain obtained from the amplifier. In some cases, however, for example in a vision mixer device (shown in FIGURE 10) for use in a television studio, where it is desirable for such a linear relation to exist, since equal changes in the settings of the resistors controlling the gain of amplifier in two channels of which the output signals are mixed (added) will then produce equal changes in the amplitudes of the two signals. When such a linear relation does exist, the fractions of the two original signals which appear in the mixed image can be read from the control settings, which simplifies the operation. A linear relation between gain and control setting, or between gain and the value of a controlling direct potential, can be obtained by using the circuit arrangement described below in relation to FIGURE 2.

This amplifier is generally similar to that described in relation to FIGURE 1. Those components operating as described in relation to FIGURE 1 are denoted by the same reference numerals and their operation will not be again described. In the arrangement of FIGURE 2, however, the resistance connecting the emitters of transistors 4 and 5 is comprised by a fixed resistor 20 in series with the emitter-collector path of a third transistor 21. The emitter potential of this third transistor 21 follows its base potential, and thus the control voltage applied to the base of the transistor from the slider of a potentiometer 22 which is connected in series with resistors 23 and 24 across the direct voltage supply. The emitter potential $V_{E''}$ of transistor 21 is given by the relation $$V_{E''}=V_R+V_O$$

where $V_R$ is the control voltage taken from potentiometer 22 and $V_O$ is the constant voltage difference appearing between the base and emitter of transistor 21. The emitter current $I_{E''}$ passing through transistor 21 is a linear function of the emitter potential $V_{E''}$ and thus also of the control of voltage $V_R$. Thus $$I_{E''}=\frac{V_{E''}-V_{E'}}{R_E}=\frac{V_R+V_O-V_{E'}}{R_E}=A\cdot V_R+B$$

where $V_{E'}$ signifies the potential at the emitter of transistor 5 and A and B are constants.

Since the current $I_{E''}$ represents the current in the gain-control resistance branch, the current through transistors 4 and 5 and thus also the gain is also a linear function of the control voltage $V_R$. Thus:

$$I_E=I_{E'}=I_O-I_{E''}=I_O-A.V_R-B=A'.V_R+B'$$
$$V=K.I_E=A''.V_R+B''$$

when $V_R=V_{E'}.I_{E''}=O$ and $V=V_{max}=K.I_O$. For $I_{E''}=I_O$, $I_E$ becomes $I_E=I_{E'}$ equal to 0, and $V=0$. This is equivalent to:

$$\frac{V_R+V_O-V_{E'}}{R_E}=I_O, \text{ or } V_R=I_O\cdot R_E-V_O+V_{E'}$$

where $I_E$=emitter current of transistor 4,
$I_{E'}$=emitter curent of transistor 5,
$I_O$=current through emitter resistors 12, 13,
$I_{E''}$=current through control resistance branch comprising resistor 20 and transistor 21,
$V$=gain,
A', B', K, A'' and B'' are constants.

FIGURES 3, 4, 5 and 6 show four different possible embodiments of the control resistance branch connecting the points 25, 26 i.e. the emitters of transistors 4 and 5. The arrangement shown in FIGURE 3 is the same as that used in FIGURE 2, comprising an npn transistor 21, in series with a fixed resistor 20. In FIGURE 4 the control transistor 21 is again of the npn type but is here connected between two series resistors 27 and 28. In the arrangement shown in FIGURE 5 is a single resistor 29 is used in series with a pnp transistor 30, while in FIGURE 6 a pnp transistor 30 is used between two series resistors 31 and 32. The use of resistors in the collector leads of the control transistors may be advantageous in preventing overloading of the transistors.

The slope of the characteristic of a transistor is substantially higher than that of a normal thermionic value. This intrinsic high slope is doubled in an amplifier according to the invention, the amplifying transistors being connected in parallel as regards signal voltages. If a usual collector resistor 18 of about 1 KΩ neutralized, a gain of 100 or more may readily be obtained, which owing to the presence of the collector-base capacitance and the Miller effect can give rise to a troublesome gain-dependent reaction upon the input signal.

In the arrangement shown in FIGURE 7, this disturbing reaction is avoided by the use of a grounded base transistor stage, comprising a pnp transistor 33 to the emitter of which the variably amplified signals are applied directly from the common-collector point 10 of a circuit as described in relation to FIGURE 1. The base of transistor 33 is held at an appropriate direct potential by means of resistors 34, 35 and an auxiliary direct voltage supply having its negative terminal grounded, and its positive terminal connected with terminal 36, while the base is held at ground potential for signal frequencies by a bypass capacitor 37 connected from the base to ground. The emitter of transistor 33 is returned to the positive terminal of the auxiliary supply by way of a resistor 38 and its collector is taken to the grounded negative line by way of a load resistor 39 and is also connected directly to an output terminal 40.

In the alternative circuit arrangement shown in FIGURE 8 the emitter of the grounded base transistor 33 is coupled to the common collector point 10 by way of a capacitor 41. Owing to the isolation of direct voltage thus effected the base of transistor 33 may now be grounded directly, while as before the emitter of transistor 33 is returned to the positive terminal of an auxiliary supply by way of a resistor 38 and its collector is taken to the grounded negative line by way of a load resistor 39 and is connected directly to an output terminal 40.

FIGURE 9 shows a preferred embodiment of variable-gain transistor amplifier in accordance with the present invention. A video signal which may have an amplitude of 12.5 mv.$_{pp}$ is applied to terminal 1 and thence by way of capacitors 2 and 3 (each 175 μf.) to the base of transistor 4 (a pnp transistor of type 2 N 1991) and to the base of transistor 5 (an npn transistor of type 2 N 1613). The bases of transistors 4 and 5 are held at appropriate direct potentials by a voltage divider chain comprising resistors 6, 8 (each 2.7 KΩ) and resistor 7 (5.6 KΩ) connected across a 12-volt supply having its negative terminal grounded via terminal 42 and its positive terminal connected with terminal 43. Resistors 12 and 13 (each 5.6 KΩ) connected in the emitter leads of transistors 4 and 5 respectively provide direct current negative feedback, while the emitters are grounded for signal potentials by way of capacitors 14, 15 (each 350 μf.), thus preventing feedback at these frequencies.

The gain-controlling resistance branch comprises two equal resistors 44, 45 (each 3.6 KΩ) and the emitter-collector path of a transistor 46 (pnp transistor type OC 468). The gain of transistors 4 and 5 may thus be adjusted by altering the setting of a potentiometer 47 (50

KΩ) which is connected in series with a fixed resistor 48 (47 KΩ) across the supply. A maximum gain of 80 and a minimum gain of zero may thus be obtained.

The common collector point 10 of transistors 4 and 5 is connected directly to the emitter of a subsequent, grounded base transistor amplifier comprising a transistor 49 (pnp transistor of type AF 114) having its emitter returned to the positive line by way of a resistor 50 (3.3 KΩ) and its collector taken to the grounded negative line by way of a load resistor 51 (1 KΩ) and is connected directly to an output terminal 52, from which there may thus be taken a signal with a maximum amplitude of 1 $v_{pp}$. With the values stated the differential amplitude distortion in the circuit arrangement described in relation to FIGURE 9 is some 2%.

Cross-fading of two video signals may conveniently be effected by making use of two circuit arrangements of the kind described in relation to FIGURE 9. The two video signals to be mixed would then be applied to the respective input terminals of the two variable-gain amplifiers and the outputs of these amplifiers would be connected to provide a signal output. Simultaneous adjustment in opposite directions of the gain-control potentiometers of the two amplifiers would then result in a cross-fade between the two input signals.

FIGURE 10 is a circuit diagram of a vision mixer circuit arrangement of the present invention. The circuit arrangement of FIGURE 10 comprises essentially the circuit arrangement of FIGURE 1, including the components 1 to 19, and a second circuit arrangement including the components 1′ to 19′ which is also essentially the circuit arrangement of FIGURE 1. Each of the circuits 1 to 19 and 1′ to 19′ functions essentially as the circuit of FIGURE 1. A first video signal is fed in via terminal 1 and a second video signal is fed in via terminal 1′. Video signals provided by the circuit arrangement are produced at the terminals 11 and 11′ and are connected from said terminals to a common outlet terminal 55. The circuits 1 to 19 and 1′ to 19′ differ from each other only in the position of the adjusting arm of each potentiometer 16 and 16′. The potentiometers 16 and 16′ are coupled by coupling link 56 in a manner whereby the resistance of the potentiometer 16 decreases as the resistance of the potentiometer 16′ increases, and the resistance of the potentiometer 16 increases as the resistance of the potentiometer 16′ decreases. At the limit positions of the coupling link 56 the resistance of one of the potentiometers 16 and 16′ is therefore at a maximum when the resistance of the other of said potentiometers is at a minimum. This relationship of the resistance values of the potentiometers 16 and 16′ is indicated in FIGURE 10 by showing the pivot point about which the adjusting arm of the potentiometer 16 moves at the right of the coupling link 56 and showing the pivot point about which the adjusting arm of the potentiometer 16′ moves at the left of said coupling link. Thus, one of the video signals supplied via the terminals 1 and 1′ is suppressed and the other is provided at the common output terminal 55 with maximum amplification.

While the invention has been illustrated and described as embodied in variable gain transistor amplifier it is not intended to be limited to the details shown, since various modifications and structural changes may be made without departing in any way from the spirit of the present invention.

What is claimed as new and desired to be secured by Letters Patent is:

1. Transistor amplifier comprising, in combination, two transistors of opposite conductivity type; an input lead; connection means applying a signal to be amplified to said input lead; an output lead; a direct voltage source having two opposite poles; connection means connecting the collectors of said transistors to a common junction point; a first resistor; a second resistor; connection means connecting the emitters of said transistors via said first and said second resistor to said opposite poles respectively of said direct voltage source; connection means connecting said input lead to the bases of said transistors; biasing means maintaining said bases of said transistors at different direct voltages; a load resistor; connection means connecting one end of said load resistor to said junction point and connecting the other end of said load resistor to one of said poles of said direct voltage source; a variable resistance; connection means connecting the emitters of said transistors via said variable resistance; connection means applying the signal at said common junction point to said output lead.

2. Biasing means according to claim 1 comprising, in combination, a voltage divider having at least two tapping points and two ends; connection means connecting said tapping points with said bases of said transistors respectively; connection means connecting said ends of said voltage divider with said opposite poles respectively of said direct voltage source.

3. Transistor amplifier according to claim 1 comprising, in combination, two capacitors having impedances at signal frequencies which are low compared with the values of said first and said second resistors; connection means connecting the emitters of said transistors via said capacitors respectively to a point of constant potential.

4. Transistor amplifier according to claim 1 comprising, in combination a blocking condenser having a negligible impedance at signal frequencies; connection means connecting said other end of said load resistor via said blocking condenser to one of said poles of said direct voltage source.

5. Variable resistance according to claim 1 comprising, in combination, an additional transistor; an additional resistor; means for applying a variable direct potential to the base of said additional transistor; connection means connecting said emitters of said transistors via the emitter-collector path of said additional transistor and via said additional resistor, whereby the resistance between the emitter and collector of said additional transistor is variable by the application to its base of said variable direct potential.

6. Variable resistance according to claim 5 wherein the range of resistance variability between the emitter and collector of said additional transistor and the resistance of said additional resistor are such that a variation of gain is obtained which is substantially proportional to the change in value of the direct potential applied to the base of said additional transistor.

7. Transistor amplifier according to claim 1, comprising a fixed resistor; connection means connecting said emitters of said transistors via said variable resistance and via said fixed resistor, the values of said variable resistance and of said fixed resistor being so chosen that the gain of said amplifier varies approximately as a linear function of the setting of said variable resistor.

8. A vision mixer circuit arrangement consisting of two transistor amplifiers according to claim 1 comprising in combination connection means connecting said output leads of said transistor amplifiers; and means for coupling said variable resistors for simultaneous and opposite adjustment.

9. Transistor amplifier comprising, in combination, two transistors of opposite conductivity type; an input lead; connection means applying a signal to be amplified to said input lead; an output lead; a direct voltage source having two opposite poles; connection means connecting the collectors of said transistors to a common junction point; a first resistor; a second resistor; connection means connecting the emitters of said transistors via said first and second resistor to said opposite poles respectively of said direct voltage source; connection means connecting said input lead to the bases of said transistors; biasing means maintaining said bases of said transistors at different direct voltages; a further transistor; connection means connecting the base of said further transistor to earth as regards signal frequency; connection means connecting said junction point to one of either the collector or emitter electrodes of said further transistor; connection means connecting the remaining one of said collector or emitter electrodes of said further transistor to said output lead; connection means connecting said collector and emitter of said further transistor to said poles respectively of said direct voltage source; a load resistor; connection means connecting said load resistor at one end to one of said poles of said direct voltage source, and at the other end to said output lead and the collector of said further transistor; a variable resistance; connection means connecting the emitters of said two transistors via said variable resistance.

References Cited by the Examiner

UNITED STATES PATENTS

| | | | |
|---|---|---|---|
| 2,544,211 | 3/1951 | Barton | 330—29 XR |
| 2,802,069 | 8/1957 | Weber | 330—123 XR |
| 2,955,257 | 10/1960 | Lindsay | 330—17 XR |
| 3,002,090 | 9/1961 | Hirsch | 330—29 XR |
| 3,032,704 | 1/1962 | Beck | 330—29 XR |

FOREIGN PATENTS

| | | |
|---|---|---|
| 135,108 | 5/1960 | U.S.S.R. |

ROY LAKE, *Primary Examiner.*

NATHAN KAUFMAN, *Examiner.*